(12) United States Patent
Li et al.

(10) Patent No.: US 7,764,500 B2
(45) Date of Patent: Jul. 27, 2010

(54) ELECTRONIC SYSTEM WITH A HEAT SINK ASSEMBLY

(75) Inventors: Dong-Yun Li, Shenzhen (CN); Wei Wu, Shenzhen (CN); Jian-Ping Yu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 223 days.

(21) Appl. No.: 11/849,128

(22) Filed: Aug. 31, 2007

(65) Prior Publication Data

US 2009/0059532 A1 Mar. 5, 2009

(51) Int. Cl.
*H05K 7/20* (2006.01)
*F28F 7/00* (2006.01)
*H01L 23/34* (2006.01)

(52) U.S. Cl. ............. 361/700; 361/679.52; 361/679.54; 361/704; 361/709; 361/719; 165/80.4; 165/104.33; 165/80.5; 174/15.2; 174/16.1; 174/548; 257/714

(58) Field of Classification Search ............ 361/679.52, 361/679.54, 699, 700, 704, 709, 710, 719; 165/80.2–80.4, 185, 104.33; 174/15.2, 16.1, 174/16.3, 548, 252; 257/714, 719, 722
See application file for complete search history.

(56) References Cited

U.S. PATENT DOCUMENTS

| 6,978,829 | B1* | 12/2005 | Lin ........................ 165/104.33 |
| 7,414,841 | B2* | 8/2008 | Chen et al. .................. 361/697 |
| 2002/0149910 | A1* | 10/2002 | Lee et al. ..................... 361/687 |
| 2005/0180102 | A1* | 8/2005 | Kim ........................... 361/694 |
| 2007/0165374 | A1* | 7/2007 | Chen et al. .................. 361/687 |

* cited by examiner

*Primary Examiner*—Zachary M Pape
(74) *Attorney, Agent, or Firm*—Jeffrey T. Knapp

(57) ABSTRACT

An electronic system comprises an enclosure, a printed circuit board in the enclosure, and a heat sink assembly comprising a holding member. The enclosure comprises a first panel and a second panel perpendicularly connecting with the first panel. The printed circuit board is mounted on the first panel of the enclosure. The heat sink assembly has a first end mounted on the printed circuit board for contacting a heat-generating electronic device on the printed circuit board, and a second end opposite to the first end. The holding member connects the second panel of the enclosure with the second end of the heat sink assembly.

17 Claims, 3 Drawing Sheets

ELECTRONIC SYSTEM WITH A HEAT SINK ASSEMBLY

BACKGROUND OF THE INVENTION

1. Field of the Invention

The present invention relates to an electronic system, and more particularly to an electronic system with a heat sink assembly.

2. Description of Related Art

It is well known that heat is produced during operation of electronic devices such as central processing units (CPUs) mounted on a printed circuit board such as a motherboard in a computer enclosure. The heat produced must be quickly removed to ensure normal operation of the electronic device. Typically, a heat sink assembly is used to remove the heat from the electronic device.

Conventionally, a heat sink assembly in an electronic system comprises a heat sink and a locking device for securing the heat sink to an electronic device mounted on a motherboard located in an enclosure of the electronic system. Generally, the motherboard is vertical in the enclosure. The heat sink is perpendicular to the motherboard and oriented horizontally. An end of the heat sink is mounted on the motherboard via the locking device and the other end of the heat sink is hung in the air in the enclosure. A weight of the heat sink produces a shearing force to the motherboard. In order to remove more and more heat from the CPU, the volume and weight of the heat sink is increased, and the shearing force produced by the heat sink to the motherboard is increased accordingly. The large shearing force can possibly cause the motherboard to rupture; when this happens, circuits and electronic components of the motherboard can be damaged.

What is needed therefore is an electronic system with a heat sink assembly which can be firmly and reliably mounted on a motherboard and produce a small shearing force to the motherboard.

SUMMARY OF THE INVENTION

According to a preferred embodiment of the present invention, an electronic system comprises an enclosure, a printed circuit board in the enclosure, and a heat sink assembly comprising a holding member. The enclosure comprises a first panel and a second panel perpendicularly connecting with the first panel. The printed circuit board is mounted on the first panel of the enclosure. The heat sink assembly has a first end mounted on the printed circuit board for contacting a heat-generating electronic device on the printed circuit board, and a second end opposite to the first end. The holding member connects the second panel of the enclosure with the second end of the heat sink assembly, thereby to fasten the second end of the heat sink assembly to the enclosure. Accordingly, the first end and the opposite second end of the heat sink assembly are both supported by the enclosure to prevent a too large shearing force generated by a weight the of heat sink assembly from acting on the printed circuit board.

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present device. Moreover, in the drawings, like reference numerals designate corresponding parts throughout the several views.

DETAILED DESCRIPTION OF THE INVENTION

Figure 1:
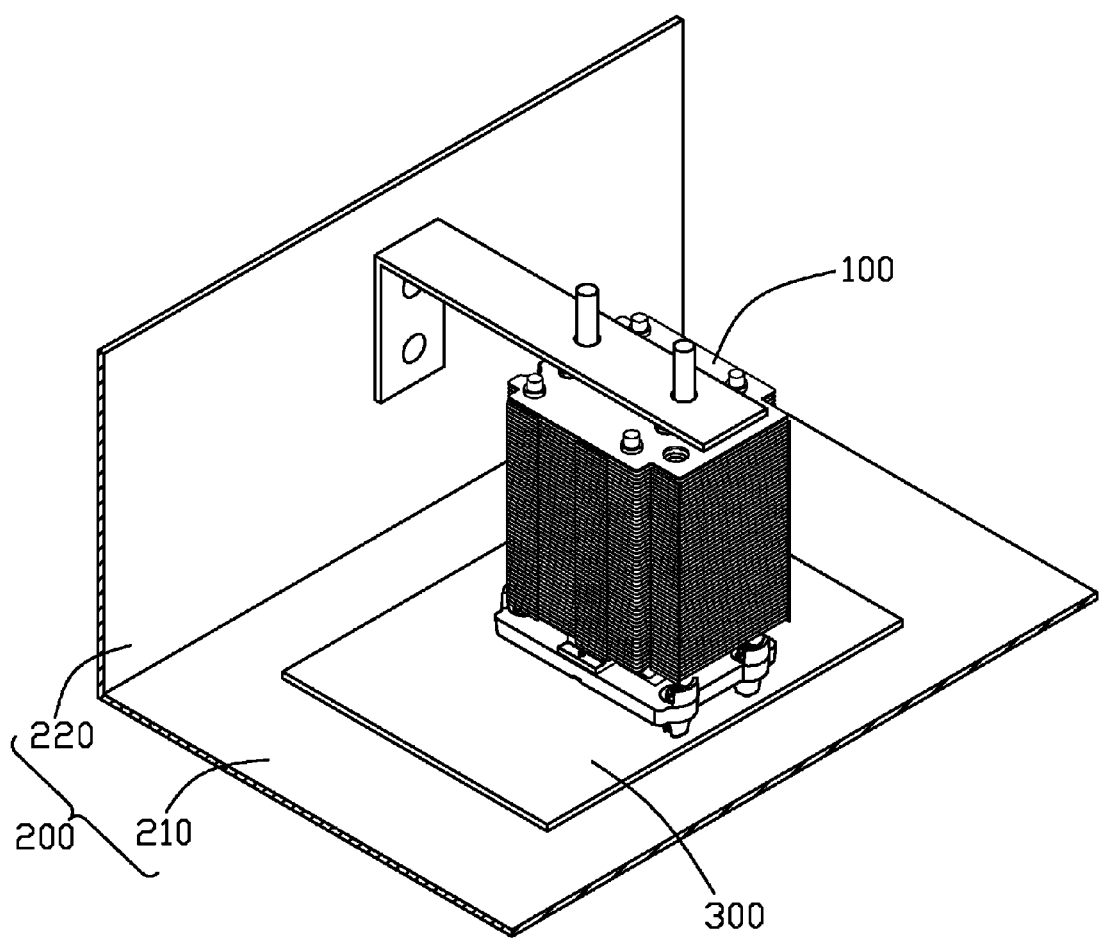
FIG. 1 is an assembled view of a heat sink assembly mounted in an enclosure of an electronic system in accordance with a preferred embodiment of the present invention.

FIG. 1 shows an electronic system in accordance with a preferred embodiment of the present invention. The electronic system comprises an enclosure 200, a printed circuit board (PCB) 300 secured in the enclosure 200, and a heat sink assembly 100 mounted on the PCB 300. The enclosure 200 comprises a first panel 210 and a second panel 220 perpendicularly connecting with the first panel 210. The PCB 300 is mounted to the first panel 210 in a parallel manner.

Figure 2:
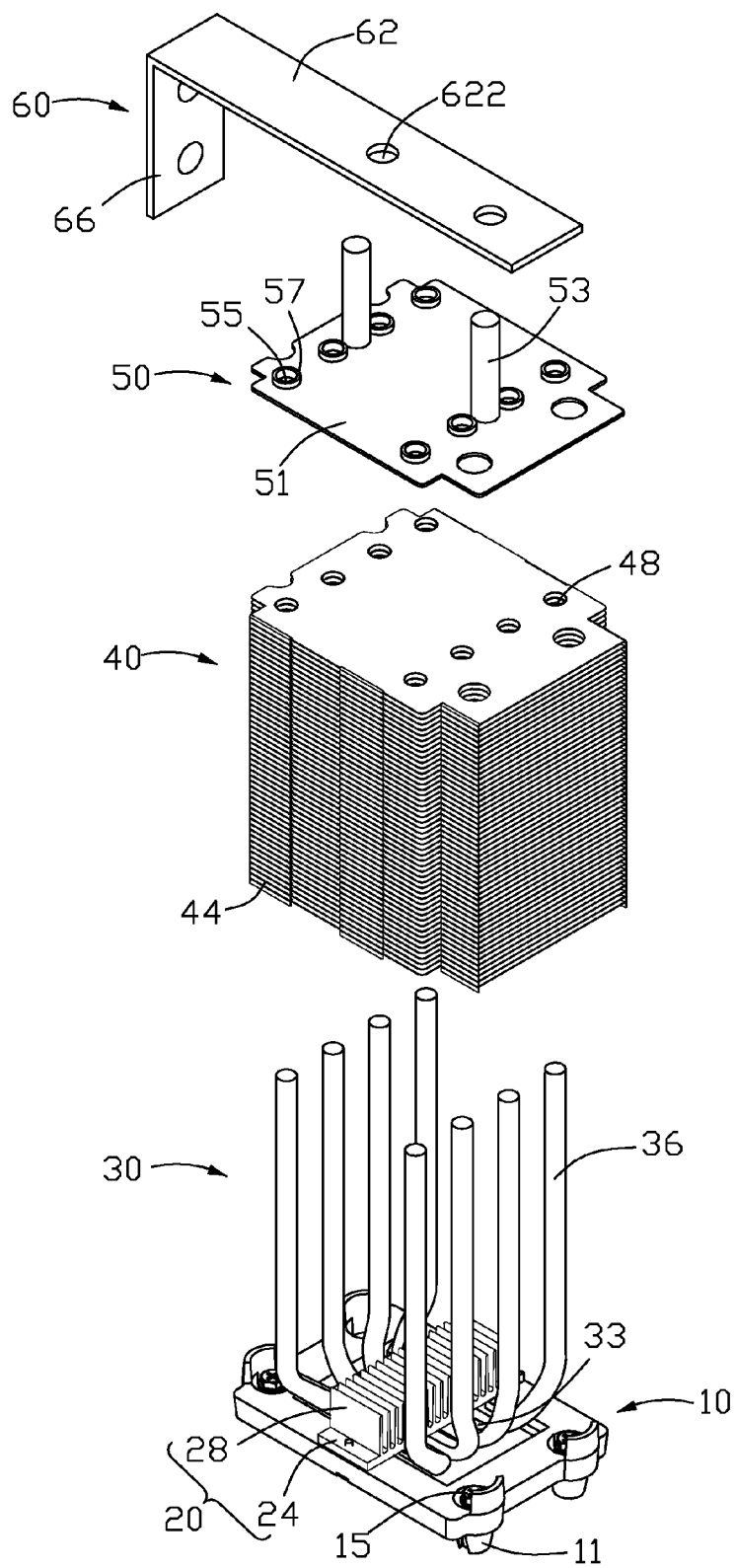
FIG. 2 is an exploded view of the heat sink assembly of FIG. 1.
Figure 3:
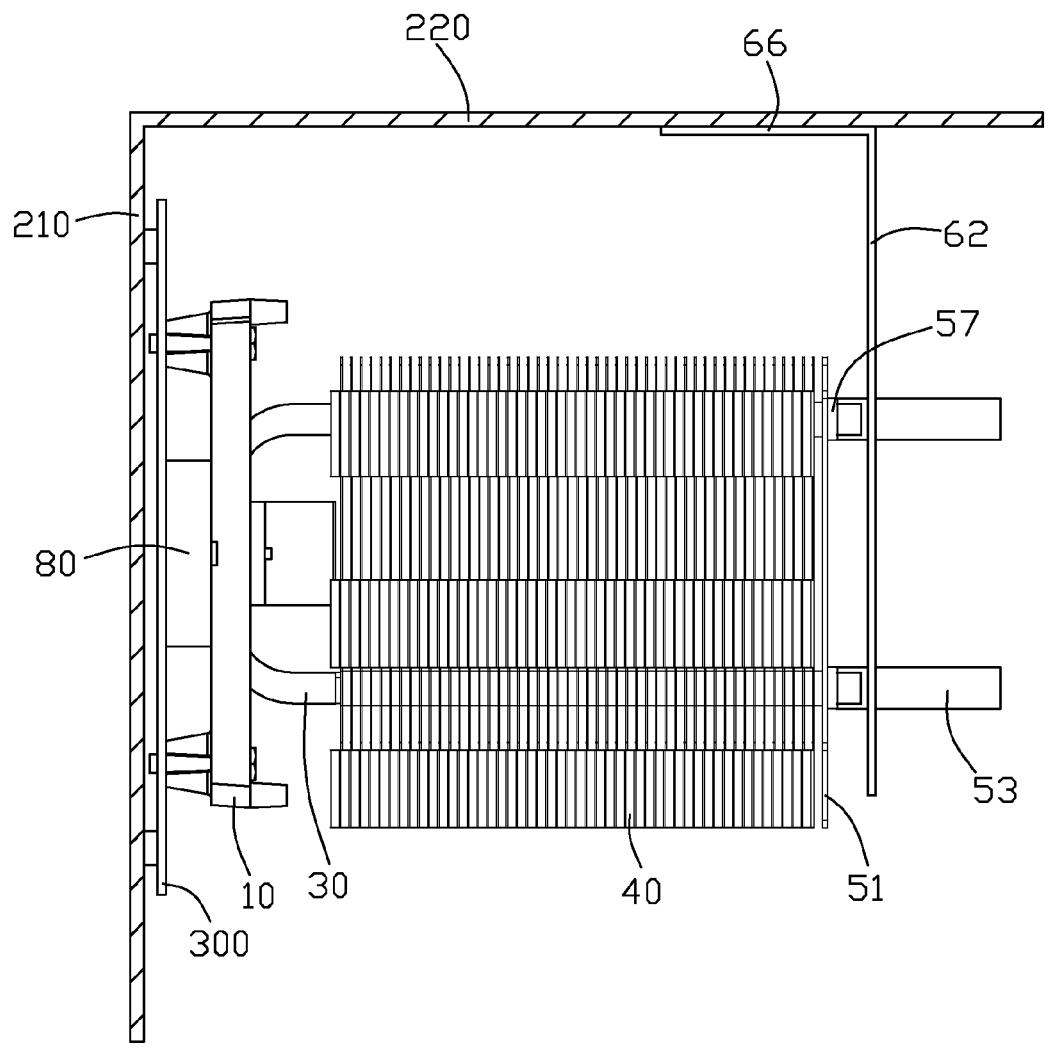
FIG. 3 is a side view of the heat sink assembly in the enclosure of FIG. 1.

Also referring to FIG. 2 and FIG. 3, the heat sink assembly 100 comprises a heat spreader 10, a heat sink 20 with a plurality of first fins 28, a plurality of second fins 40, and four U-shaped heat pipes 30 thermally connecting the heat spreader 10 with the heat sink 20 and the second fins 40. The heat sink assembly 100 further comprises a connecting member 50 for connecting with the heat pipes 30 at a position remote from the heat spreader 10. A holding member 60 is for connecting the connecting member 50 with the second panel 220 of the enclosure 200.

The heat spreader 10 has a bottom face (not labeled) for contacting a CPU 80 mounted on the PCB 300 to absorb heat of the CPU 80, and a top face (not labeled) with four grooves (not shown) defined therein. Four hollow locking feet 11 extend downwardly from four corners of the heat spreader 10. The heat spreader 10 thermally engages with the CPU 80 mounted on the PCB 300 by extending four fasteners 15 through the locking feet 11 to threadedly engage with retainers (not shown) attached to a bottom side of the PCB 300.

Each heat pipe 30 comprises a flat evaporating portion 33 and a pair of condensing portions 36 vertically extending from two opposite ends of the evaporating portion 33 and parallel to each other. The evaporating portions 33 of the heat pipes 30 are soldered in the grooves of the heat spreader 10. The condensing portions 36 vertically extend through the second fins 40 and the connecting member 50.

The heat sink 20 comprises a bottom plate 24 having a bottom face (not labeled) soldered on top faces of the evaporating portions 33 of the heat pipes 300 and the heat spreader 10. The first fins 28 vertically extend from the bottom plate 24 and parallel to each other.

The second fins 40 are soldered with the heat pipes 30 and parallel to the heat spreader 10. Each second fin 40 is approximately rectangular and made from a metal sheet. Each second fin 40 extends two sets of flanges 44 perpendicularly from two opposite edges thereof. The flanges 44 are parallel to the first fins 28 and space two adjacent second fins 40 with a uniform distance, whereby channels (not labeled) are defined between the second fins 40 to facilitate an airflow to flow through the second fins 40. Channels (not labeled) of the first fins 28 and the channels of the second fins 40 are all opened laterally. The second fins 40 are perforated with through holes 48. Each of the through holes 48 is surrounded by a respective annular sidewall (not labeled) that is formed during punching the corresponding through hole 48. The condensing portions 36 of the heat pipes 30 are received in the through holes 48 and soldered to the sidewalls so that the second fins 40 are combined with the condensing portions 36 of the heat pipes 30 and located above the heat sink 20.

The connecting member 50 comprises a base 51 located close to a top one of the second fins 40 and two solid columns 53 extending upwardly from the base 51. The base 51 has a configuration the same as the second fins 40 and defines through holes 55 corresponding to the through holes 48 of the second fins 40. Each of the through holes 55 is surrounded by a respective annular sidewall 57. The connecting member 50 is firmly soldered to top ends of the condensing portions 36 of the heat pipes 30.

The holding member 60 comprises a mounting plate 66 and a receiving plate 62 perpendicularly extending from the mounting plate 66. The receiving plate 62 defines two through holes 622 for receiving the solid columns 53 of the connecting member 50 therein. The solid columns 53 are soldered in the through holes 622. The mounting plate 66 is securely mounted to the second panel 220 of the enclosure 200 via screws (not shown) or other means.

Referring again to FIG. 3, when the heat sink assembly 100 is assembled in the enclosure 200, the heat sink assembly 100 is mounted horizontally. A first end of the heat sink assembly 100 wherein the heat spreader 10 is located is mounted on the PCB 300 in the enclosure 200 via the fasteners 15. Simultaneously, a second end of the heat sink assembly 100 wherein the connecting member 50 is located connects with the second panel 220 of the enclosure 200 via the holding member 60. Therefore, the heat sink assembly 100 is supported at both the first end and second end. The weight of the heat sink assembly 100 is also supported by the holding member 60, thereby greatly reducing a shearing force produced by the weight of the heat sink assembly 100 to the PCB 300. The heat sink assembly 100 is firmly and stably mounted in the enclosure 200, and the PCB 300 is free from rupture, which may occur due to the heavy weight of the heat sink assembly 100.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electronic system comprising: an enclosure comprising a first panel and a second panel connecting with the first panel; a printed circuit board mounted on the first panel of the enclosure; and a heat sink assembly having a first end mounted on the printed circuit board for contacting a heat-generating electronic device on the printed circuit board, a second end opposite to the first end, and a holding member connecting the second panel of the enclosure with the second end of the heat sink assembly; wherein the holding member comprises a mounting plate secured on the second panel of the enclosure and a receiving plate perpendicularly extending from the mounting plate; wherein the heat sink assembly comprises a connecting member at the second end thereof, the connecting member connecting with the receiving plate of the holding member; and wherein the connecting member of the heat sink assembly has at least a column extending therefrom and soldered in the receiving plate of the holding member, wherein the heat sink assembly further comprises a heat pipe extending from the first end to the second end thereof, the connecting member comprising a base, the heat pipe engaging with the base of the connecting member, the at least a column extending from the base.

2. The electronic system of claim 1, wherein the second panel of the enclosure is perpendicular to the first panel of the enclosure.

3. The electronic system of claim 1, wherein the heat pipe comprises an evaporation portion soldered with a heat spreader and a pair of condensing portions vertically extending from the evaporating portion, the condensing portions connecting with the base of the connecting member.

4. The electronic system of claim 3, wherein the heat sink assembly further comprises a plurality of fins soldered with the condensing portions of the heat pipe and parallel to the heat spreader, the base of the connecting member, the fins and the receiving plate of the holding member being parallel to each other.

5. The electronic system of claim 4, wherein the heat sink assembly further comprises a heat sink mounted between the evaporating portion of the heat pipe and the fins.

6. The electronic system of claim 4, wherein the at least a column of the connecting member is perpendicular to each fin of the heat sink assembly, the base of the connecting member being located between the fins and the receiving plate of the holding member.

7. The electronic system of claim 4, wherein each of the condensing portions of the heat pipe is soldered with the fins and the base of the connecting member.

8. The electronic system of claim 1, wherein the receiving plate of the holding member is located over the connecting member and defines at least a through hole corresponding to the at least a column of the connecting member, the receiving plate being disposed on the connecting member in a manner that the at least a column extends through the at least a through hole of the receiving plate.

9. A heat sink assembly mounted on a printed circuit board secured in an enclosure, comprising: a heat spreader mounted on the printed circuit board; a heat pipe comprising an evaporation portion secured on the heat spreader and a pair of condensing portions extending from the evaporation portion; a connecting member connecting with the condensing portions of the heat pipe at a position remote from the heat spreader; a holding member connecting with the connecting member and the enclosure, whereby both the heat spreader and the connecting member are supported by the enclosure; and a heat sink, wherein the heat sink comprises a plurality of first fins mounted on the evaporation portion of the heat pipe, and a plurality of second fins is mounted between the heat sink and the connecting member, each of the condensing portions of the heat pipe extending through all of the second fins and the connecting member, wherein the connecting member comprises a base secured with the condensing portions of the heat pipe and a column extending from the base, the base of the connecting member being parallel to each of the second fins and the receiving plate of the holding member, and the column being perpendicular to each of the second fins.

10. The heat sink assembly of claim 9, wherein the holding member defines a through hole receiving the column of the connecting member therein, the column being soldered in the through hole of the holding member, thereby securing the column with the holding member.

11. The heat sink assembly of claim 9, wherein the base of the connecting member defines two through holes each having an annular sidewall for connecting with a corresponding condensing portion of the heat pipe.

12. The heat sink assembly of claim 9, wherein the holding member comprises a receiving plate connecting with the connecting member and located over the connecting member, the receiving plate being parallel to the heat spreader.

13. An electronic system comprising: an enclosure having a first panel and a second panel perpendicularly extending from the first panel; a printed circuit board mounted to the first panel and oriented vertically, the printed circuit board having a heat-generating electronic component mounted thereon; a heat sink assembly having a first end fixed to the printed circuit board, a heat spreader located at the first end and contacting the electronic component, and a second end remote from the first end; and a holding member interconnecting the second end of the heat sink assembly and the second panel of the enclosure, whereby a weight of the heat sink assembly is also supported by the second panel; wherein the holding member has a plate-shaped configuration, and comprises a mounting plate secured on the second panel of the enclosure and a receiving plate perpendicularly extending from the mounting plate and secured with the second end of the heat sink assembly; and wherein the heat sink assembly comprises a plurality of parallel fins and a connecting member located over a top one of the fins and parallel to the fins, a column extends upwardly from a top surface of the connecting member, the receiving plate of the holding member defines a through hole corresponding to the column of the connecting member, and the receiving plate is disposed on the connecting member in a manner that the column extends through the through hole of the receiving plate of the holding member, wherein the heat sink assembly comprises a heat pipe having an evaporating portion soldered to the heat spreader and a condensing portion extending from the evaporating portion to a position near the at least a column.

14. The electronic system of claim 13, wherein the fins of the heat sink assembly are located between the connecting member and the heat spreader.

15. The electronic system of claim 13, wherein each of the condensing portions of the heat pipe extends through the connecting member and all of the fins of the heat sink assembly.

16. The electronic system of claim 13, wherein the column of the connecting member is soldered in the through hole of the receiving plate of the holding member.

17. The electronic system of claim 13, wherein the connecting member is parallel to the first panel of the enclosure and the receiving plate of the holding member, and the column is perpendicular to the first panel of the enclosure.

* * * * *